Figure 1:
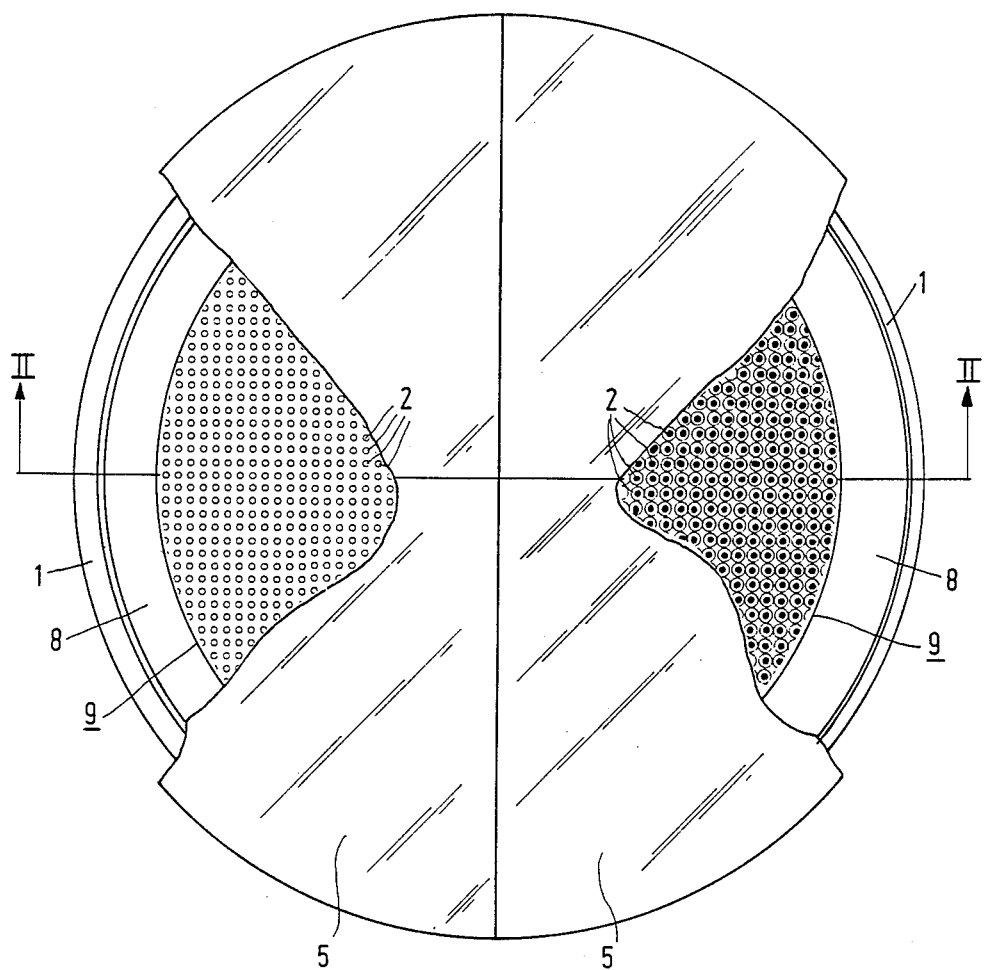

United States Patent [19]

Huberts

[11] Patent Number: 4,856,766
[45] Date of Patent: Aug. 15, 1989

[54] VACUUM APPARATUS FOR HOLDING WORKPIECES

[75] Inventor: Petrus A. A. Huberts, Mierlo, Netherlands

[73] Assignee: Philips & Du Pont Optical Company, New York, N.Y.

[21] Appl. No.: 167,812

[22] Filed: Mar. 14, 1988

[30] Foreign Application Priority Data

Jul. 8, 1987 [NL] Netherlands ............... 8701603

[51] Int. Cl.⁴ ............................................. B25B 11/00
[52] U.S. Cl. ..................................................... 269/21
[58] Field of Search ................. 269/21, 20; 51/235; 294/64.1, 64.2; 279/3; 408/76; 248/362, 363

[56] References Cited

U.S. PATENT DOCUMENTS

| | | | |
|---|---|---|---|
| 2,133,518 | 10/1938 | Huebner | 269/21 |
| 2,936,139 | 5/1960 | Lindstrom | 269/21 |
| 2,983,638 | 5/1961 | Quehl | 269/21 |

FOREIGN PATENT DOCUMENTS 829536  7/1989  U.S.S.R. ............... 294/64.2

Primary Examiner—Robert C. Watson

[57] ABSTRACT

For holding workpieces by vacuum suction a vacuum apparatus comprises a base carrying a plurality of spaced-apart support members (2) whose free end surfaces (3) define a supporting plane (4) for the workpiece, the spacings between the support members forming part of an evacuable vacuum space (6) which is peripherally sealed in a vacuum-tight manner by sealing means (7). The support members are made rim shaped and are of an elastically axially deformable material and the sealing means comprise a deformable sealing lip (8), so that after positioning the workpiece (5) and upon evacuation of the vacuum space (6) the sealing lip is moved under simultaneous axial deformation of the support members (2), causing the transverse dimensions of the support members to increase and at the same time the volume of the vacuum space to be reduced.

6 Claims, 2 Drawing Sheets

VACUUM APPARATUS FOR HOLDING WORKPIECES

The invention relates to a vacuum apparatus for holding workpieces and comprising: a base carrying a set of spaced-apart support members whose free end surfaces define a supporting plane for a workpiece, the spacings between the support members forming part of an evacuable vacuum space, and sealing means which surround the set of support members and which provide vacuum-tight sealing to a workpiece to be held.

U.S. Patent Specification No. 4,213,698 (herewith incorporated by reference) describes a vacuum apparatus of this type. The apparatus is adapted to hold, in particular, silicon wafers whose surface is to be patterned by photolighography in the fabrication of integrated circuits. The set of support members comprises a plurality of metal pins whose free end surfaces are smooth and planar, in such a way that together they accurately define the supporting plane for the workpiece. The sealing means comprise a sealing ring which is disposed on the upper edge of a cylindrical wall, which cylindrical wall bounds the circumference of the vacuum space. A silicon wafer is placed on the vacuum apparatus in such a way that the periphery of the silicon wafer slightly protrudes from the sealing ring. The sealing ring has a smooth planar upper edge surface disposed in the supporting plane. Thus, the silicon wafer is disposed accurately in a fixed supporting plane at the instant at which the vacuum space is evacuated. By evacuating the vacuum space the silicon wafer is fixed in the supporting plane.

The known apparatus is adapted to hold workpieces, such as silicon wafers, having a comparatively high rigidity. However, the apparatus is less suitable for workpieces which are less rigid or which are made of a comparatively thin material. It is difficult to make the spacings between the support members small, because this would complicate the apparatus. Another disadvantage of the known apparatus is that, in fact, it is suitable for use in dust-free spaces only, at least when a highly planar workpiece is required. If a contaminant is present on the end surface of one of the pins, in particular if the contaminant is a hard particle such as a grain of sand or the like, this may result in the workpiece being locally subjected to very large stresses. This leads at least to local distortion of the workpiece and may even give rise to fracture. As a result of the high accuracy with which the free end surfaces of the support members and the sealing means must be situated in the supporting plane the known apparatus is comparatively expensive, so that it has a rather limited use.

It is the object of the invention to provide a vacuum apparatus of the type defined in the opening paragraph, which is less expensive, which is adapted for use with thin and/of fragile workpieces, which is considerably less susceptible to contamination, and which enables a small-volume vacuum space to be employed. To this end the invention is characterized in that it includes a plurality of support members made of an elastically deformable material, and in that the sealing means comprise movable parts, so that after positioning a workpiece and upon evacuation of the vacuum space the movable parts of the sealing means perform a movement under simultaneous axial deformation of the elastic support members, causing the transverse dimensions of the elastic support members to increase and at the same time the volume of the vacuum space to be reduced. Since the elastic support members are elastically deformable, the effect of a dust particle or grain at the location of an elastic support member on the distortion of the workpiece will be substantially smaller, so that the resulting deformation stresses are also reduced substantially. This is because the relevant support member is capable of a certain local deflection as a result of its elastic deformability. Nevertheless, an accurately defined final position of the workpiece is obtained. The transverse dimensions of the elastic support members increase, so that deformation stresses decrease. The elastic support members can be arranged so close to one another that in the deformed situation they contact one another, eventually resulting in a continuous—or at least substantially continuous—supporting surface. Each embodiment has the advantage that the volume of the vacuum space decreases as the deformation of the elastic support members increases, so that the workpiece is rapidly held with a minimal use of vacuum. Admitting air to the vacuum space to remove the workpiece can also take place rapidly. It has been found that thin electroformed nickel shells having a diameter of approximately 30 cm and a thickness of approximately 100 microns can be held by a vacuum apparatus in accordance with the invention, the axial deformation of the workpiece surface being less than approximately 5 microns. Such thin nickel shells are used in the replication of optically readable information discs. The nickel shell carries an information structure in its surface, which structure can be read by means of a radiation beam such as a laser beam when the shell is rotated while held by the vacuum apparatus.

Preferably, an embodiment of the invention is used, which is characterized in that the elastic support members belong to a supporting pad comprising a substantially plane-parallel pad body from which elastic support members project to one side. Such a pad body carrying elastic support members is easy to mount on the base of a vacuum apparatus. Suitably, an embodiment is used, which is characterized in that the pad body and the elastic support members together form an integral unit made, at least for the greater part, of an elastic material. A further embodiment, which is easy to combine with all the preceding embodiments, is characterized in that the elastic support members are made of an elastomer.

A pad member which has been found to perform satisfactorily in practice is made of a pad material which is known for the coating of table-tennis paddles. Such a pad material is commercially available at low cost. The pad material comprises a textile web embedded in an elastomer from which the elastic support members are also made. These members take the form of closely spaced parallel cylindrical pins. The use of an elastomer is very important in many cases. This is because elastomers have the property that under compression the volume of an elastomeric body does not or not significantly alter. This means that the elastic deformation gives rise to a change in shape of the elastic support members but not a change in volume. The significance of this will be set forth in detail hereinafter in the description with reference to the drawings.

Another suitable embodiment of the invention is characterized in that the sealing means comprise an annular body having an axially deformable elastic sealing lip. Such sealing lips can be manufactured economically from a suitable plastic or elastomer and provide satisfactory sealing.

Another embodiment is of particular advantage for holding liquid-immersed workpieces. In the fabrication of information carriers, such as gramophone records or optically readable discs, it is customary to utilize nickel shells which have been electroformed in a nickel bath and which can be used as stampers in a transfer or injection-molding process or which form an intermediate product in the manufacture of a stamper. To this end a workpiece in the form of a disc carrying an information structure on its surface is arranged on a rotating spindle, which is subsequently immersed in the nickel bath. If the vacuum apparatus in accordance with the invention is used, it is not unlikely that liquid is drawn out of the bath. In that case it is advantageous to employ an embodiment of the invention which is characterized in that the vacuum space is connected to an evacuating arrangement comprising an ejector pump operating with a working fluid. Generally, pneumatic ejector systems are less suitable for evacuating large vacuum spaces, but for the present use the vacuum space can be very small and, in principle, need not be much larger than the spacings between the support members. Any liquid drawn out of the bath is discharged together with the working medium by ejector and, if desired, it can readily be collected in a suitable vessel.

Figure 2:
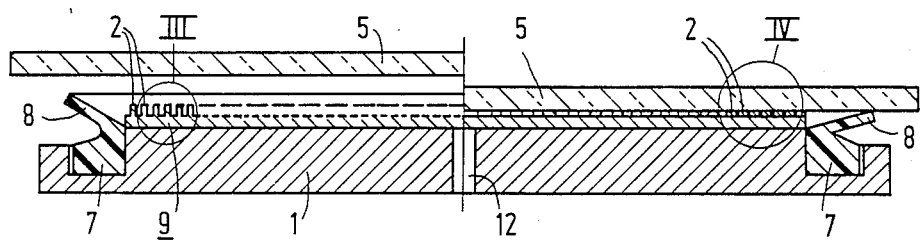
Figure 3:
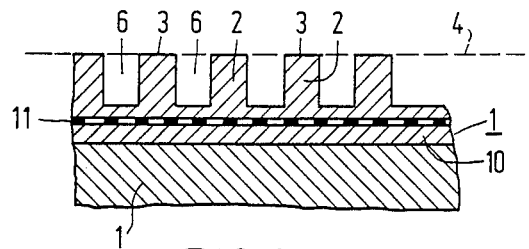
Figure 4:
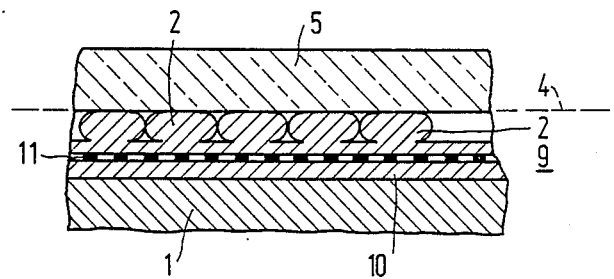
Figure 5:
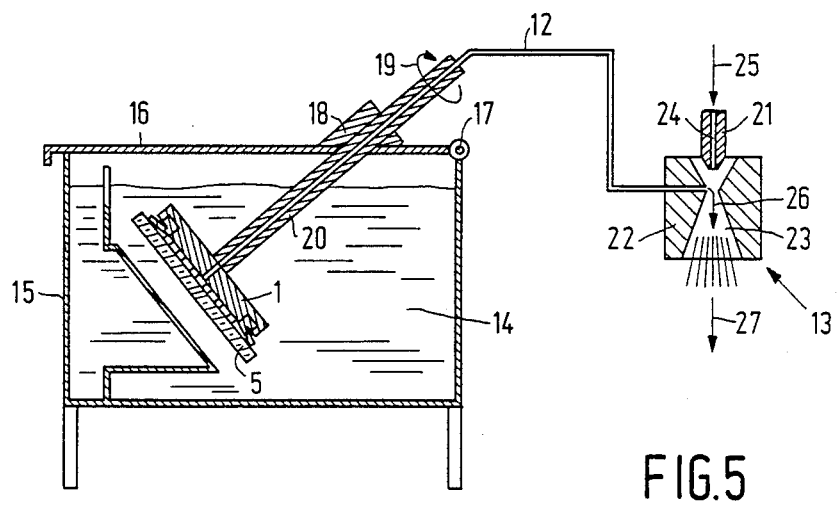

Embodiments of the invention will now be described in more detail, by way of example, with reference to the accompanying drawings, in which:

FIG. 1 is a plan view of a vacuum apparatus in accordance with the invention on which a thin glass plate is arranged, the left-hand part of the Figure relating to a situation in which the glass plate is not held by suction and the right-hand part to a situation in which the glass plate is held in position by suction, the glass plate in both halves of the Figure being cut away partly to show the part of the vacuum apparatus situated underneath it, FIG. 2 is a cross-sectional view taken on the lines II—II in FIG. 1, FIG. 3 shows the part indicated by III in FIG. 2, FIG. 4 shows the part indicated by IV in FIG. 2, and FIG. 5 diagrammatically shows an embodiment of the invention used in an electroforming apparatus.

The vacuum apparatus shown in the drawings comprises a base 1 in the form of a round disc made of, for example, a metal or another suitable material. The base carries a plurality of spaced-apart elastic support members 2 whose free end surfaces 3 define a supporting plane 4 for a workpiece 5 which in the present case is a thin glass disc. Since in the embodiment shown, all the support members are elastic, for the sake of simplicity the elastic support members will be referred to simply as "support members". The spacings 6 (FIG. 3) between the support members form part of an evacuable vacuum space. The set of support members is surrounded by sealing means 7 which provide vacuum-tight sealing to the workpiece 5.

The support members 2 are made of an elastically deformable material and the sealing means 7 comprise an axially movable lip 8, so that after positioning the workpiece 5 and evacuation of the vacuum space 6 the lip 8 is moved under simultaneous axial deformation of the support members 2, causing the transverse dimensions of the support members to increase and the volume of the vacuum space to decrease.

The elastic support members 2 form part of a supporting pad 9, comprising a substantially plane-parallel pad body 10 (FIG. 3). The pad body 10 and the support members 2 together form an integral unit which, at least for the greater part, is made of an elastic material such as an elastomer. In the embodiments shown the supporting pad has been cut from a commercially available pad material which is generally utilized for coating table-tennis paddles. The pad body is re-inforced by means of a textile web 11. This commercially available material is found to be of a suitable quality for the present object. The pin-shaped support members 2 have differences in height of the order of magnitude of only $10\mu$, the differences in diameter also being very small.

The sealing means 7 are manufactured integrally, including the sealing lip 8, as a ring made of a suitable material such as silicone rubber, which is attached to the base 1 in a suitable manner, such as by glueing or clamping.

For evacuating the vacuum space between the workpiece 5 and the supporting pad 9, peripherally sealed by the sealing lip 8, a vacuum duct 12 (FIG. 2) is formed in the base 1. The duct opens into the vacuum space between the support members 2.

FIG. 5 shows an embodiment of the invention in which the vacuum duct 12 is connected to an evacuating arrangement 13. The workpiece 5 is immersed in a liquid 14 in a container 15 of an electroforming arrangement. Since the electroforming arrangement is not relevant to the present invention it is shown only diagrammatically and will not be described in detail. It is to be noted that the arrangement may be, for example, of the type as described in European Patent Application No. 0,058,649 A1 (herewith incorporated by reference). At the top the container 15 is closed by a cover 16 which can be swung open by means of a hinge 17. The cover is provided with a bearing 18 for a hollow tube 20 which is rotatable as indicated by 19 and which at its end carries the base 1 of the vacuum apparatus. The vacuum duct 12 continues in the tube 20 to terminate in the evacuation apparatus 13.

The diagrammatically shown evacuating arrangement comprises a nozzle 21 and injector body 22 having an internal venturi duct 23. The nozzle 21 has a discharge opening 24 through which air is forced in the direction indicated by the arrow 25. The vacuum duct 12 terminates in the constriction of the venturi 23, so that the local pressure difference causes the air in the vacuum space and in the vacuum duct to stream in the direction indicated by the arrow 26 and to be discharged from the evacuating arrangement, as is indicated by the arrow 27.

An important advantage of the invention is that in the evacuated condition (see FIG. 4) the supporting plane 4 is well-defined and its position is virtually independent of possible variations in the vacuum. This is because, starting from a specific pressure difference, the support members 2 are subjected to such a deformation in the transverse direction that they contact each other, thus substantially restraining further elastic axial deformation. The support members may be deformed to an even greater extent than illustrated in FIG. 4 and, in principle, to the extent that there is not any clearance at all between the support members. In that case a further evacuation of the vacuum space no longer leads to a further axial deformation of the support members, at least when the support members are made of an elastomer. This is because, as already stated, elastomers are substantially incompressible. The vacuum apparatus in accordance with the invention is therefore also suitable for holding objects in an accurately predefined plane, independently of slight differences in vacuum.

Although only one embodiment of the invention has been described, a variety of other embodiments are possible within the scoped of the invention as defined in the appended claims. The support members need not be of circular cross-section but may have any other suitable shape. They need not be made of an elastomer but, if desired, they can be made of another material. The vacuum apparatus need not be planar but may have, for example, a curved shape for holding non-flat workpieces, or for holding workpieces to be given and held in a non-flat shape. In addition to a set of spaced-apart elastic support members another set of support members may be provided, for example comprising non-deformable spacing members to define the position of the supporting plane 4 in the evacuated condition.

In addition to the aforementioned advantages of the invention over the prior art, many further advantages may manifest themselves when the apparatus in accordance with the invention is compared with other vacuum apparatuses.

What is claimed is:

1. A vacuum apparatus for holding workpieces and comprising:
    a base (1) carrying a set of spaced-apart support members (2) whose free end surfaces (3) define a supporting plane (4) for a workpiece (5), the spacings (6) between the support members forming part of an evacuable vacuum space, and
    sealing means (7) which surround the set of support members and which provide vacuum-tight sealing to a workpiece (5) to be held, wherein said set of support members includes a plurality of pin shaped elastic support members (2) made of an elastically axially deformable material, and
    the sealing means (7) comprise movable parts (8), so that after positioning a workpiece (5) and upon evacuation of the vacuum space (6) said parts (8) of the sealing means perform a movement under simultaneous axial deformation of the pin shaped elastic support members, causing the dimensions of the elastic support members transverse to their axes to increase and at the same time the volume of the vacuum space to be reduced.

2. A vacuum apparatus as claimed in claim 1, characterized in that the elastic support members (2) belong to a supporting pad (9) comprising a substantially plane-parallel pad body (10) from which support members project to one side.

3. A vacuum apparatus as claimed in claim 2, characterized in that the pad body (10) and the elastic support members (2) together form an integral unit made, at least for the greater part, of an elastic material.

4. A vacuum apparatus as claimed in claim 1, characterized in that the elastic support members (2) are made of an elastomer.

5. A vacuum apparatus as claimed in claim 1, characterized in that the sealing means (7) comprise an annular body having an axially deformable elastic sealing lip (8).

6. A vacuum apparatus as claimed in claim 1, for holding workpieces immersed in a liquid (14), characterized in that the vacuum space is connected to an evacuating arrangement (13) comprising an ejector pump operating with a working fluid.

* * * * *